US012408369B2

(12) United States Patent
Lee et al.

(10) Patent No.: US 12,408,369 B2
(45) Date of Patent: Sep. 2, 2025

(54) VERTICAL TRANSPORT FIELD EFFECT TRANSISTORS HAVING DIFFERENT THRESHOLD VOLTAGES ALONG THE CHANNEL

(71) Applicant: International Business Machines Corporation, Armonk, NY (US)

(72) Inventors: Choonghyun Lee, Kanagawa (JP); Takashi Ando, Eastchester, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 17/505,771

(22) Filed: Oct. 20, 2021

(65) Prior Publication Data

US 2023/0124673 A1  Apr. 20, 2023

(51) Int. Cl.
*H10D 30/63* (2025.01)
*H10D 30/01* (2025.01)
(Continued)

(52) U.S. Cl.
CPC .......... *H10D 30/63* (2025.01); *H10D 30/025* (2025.01); *H10D 62/307* (2025.01);
(Continued)

(58) Field of Classification Search
CPC .. H10D 30/025; H10D 30/63; H10D 84/0167; H10D 84/0195; H10D 84/038; H10D 84/01; H10D 84/85; H10D 84/856; H10D 84/8311; H10D 84/8312; H10D 84/83135; H10D 84/83138; H10D 84/8314; H10D 84/8316; H10D 84/835; H10D 84/836; H10D 84/837; H10D 84/839; H10D 84/0128; H10D 84/0156; H10D 62/307;
(Continued)

(56) References Cited

U.S. PATENT DOCUMENTS 5,208,172 A * 5/1993 Fitch ............... H10B 12/31
257/E29.267
5,382,816 A * 1/1995 Mitsui ............. H10D 30/611
257/E29.267
(Continued)

FOREIGN PATENT DOCUMENTS

EP  3404703 A1  11/2018

OTHER PUBLICATIONS

Singh, "A Multi Vt approach for Silicon Nanotube FET with Halo Implantation for improved DIBL", Research Gate; Nov. 2018; 5pages.
(Continued)

*Primary Examiner* — Michael M Trinh
(74) *Attorney, Agent, or Firm* — Cantor Colburn LLP; Samuel Waldbaum

(57) ABSTRACT

Embodiments are for vertical field effect transistors having different threshold voltages along the channel. A vertical fin having a vertical channel is formed, one end of the vertical channel including a doped layer, the doped layer causing a threshold voltage at the one end to be different from a remainder of the vertical channel. A source and a drain are formed each coupled to opposite ends of the vertical fin, gate material being formed on the vertical channel.

10 Claims, 15 Drawing Sheets

(51) Int. Cl.
*H10D 62/17* (2025.01)
*H10D 84/01* (2025.01)
*H10D 84/03* (2025.01)
*H10D 84/85* (2025.01)
*H10D 62/822* (2025.01)

(52) U.S. Cl.
CPC ..... *H10D 84/0167* (2025.01); *H10D 84/0195* (2025.01); *H10D 84/038* (2025.01); *H10D 84/85* (2025.01); *H10D 84/856* (2025.01); *H10D 62/822* (2025.01)

(58) Field of Classification Search
CPC .... H10D 62/822; H10D 62/83; H10D 62/314; H10D 62/299
See application file for complete search history.

(56) References Cited

U.S. PATENT DOCUMENTS

| | | |
|---|---|---|
| 8,809,171 B2 | 8/2014 | Xu et al. |
| 9,553,092 B2 | 1/2017 | Bao et al. |
| 9,653,585 B2 * | 5/2017 | Zhang ................... H10D 30/63 |
| 9,837,416 B2 | 12/2017 | Walke et al. |
| 9,960,271 B1 | 5/2018 | Xie et al. |
| 10,141,448 B1 * | 11/2018 | Miao ................... H10D 84/0184 |
| 10,937,883 B2 | 3/2021 | Lee et al. |
| 2014/0021485 A1 * | 1/2014 | Cho ...................... H10D 62/832 |
| | | 257/77 |
| 2019/0157452 A1 * | 5/2019 | Kim ................... H10D 30/6728 |
| 2020/0357898 A1 * | 11/2020 | Lee ...................... H10D 30/025 |

OTHER PUBLICATIONS

Baek et al., "Device Optimization of N-Channel MOSFETs with Lateral Asymmetric Channel Doping Profiles", Transactions on Electrical and Electronic Materials, vol. 11, No. 1, Feb. 25, 2010, pp. 15-19.

Narsimhulu et al., "Impact of lateral asymmetric channel doping on deep submicrometer mixed-signal device and circuit performance", IEEE Transactions on Electron Devices 50(12), Doi:10.1109/TED. 2003.820120, Dec. 2003, 10 pages.

* cited by examiner

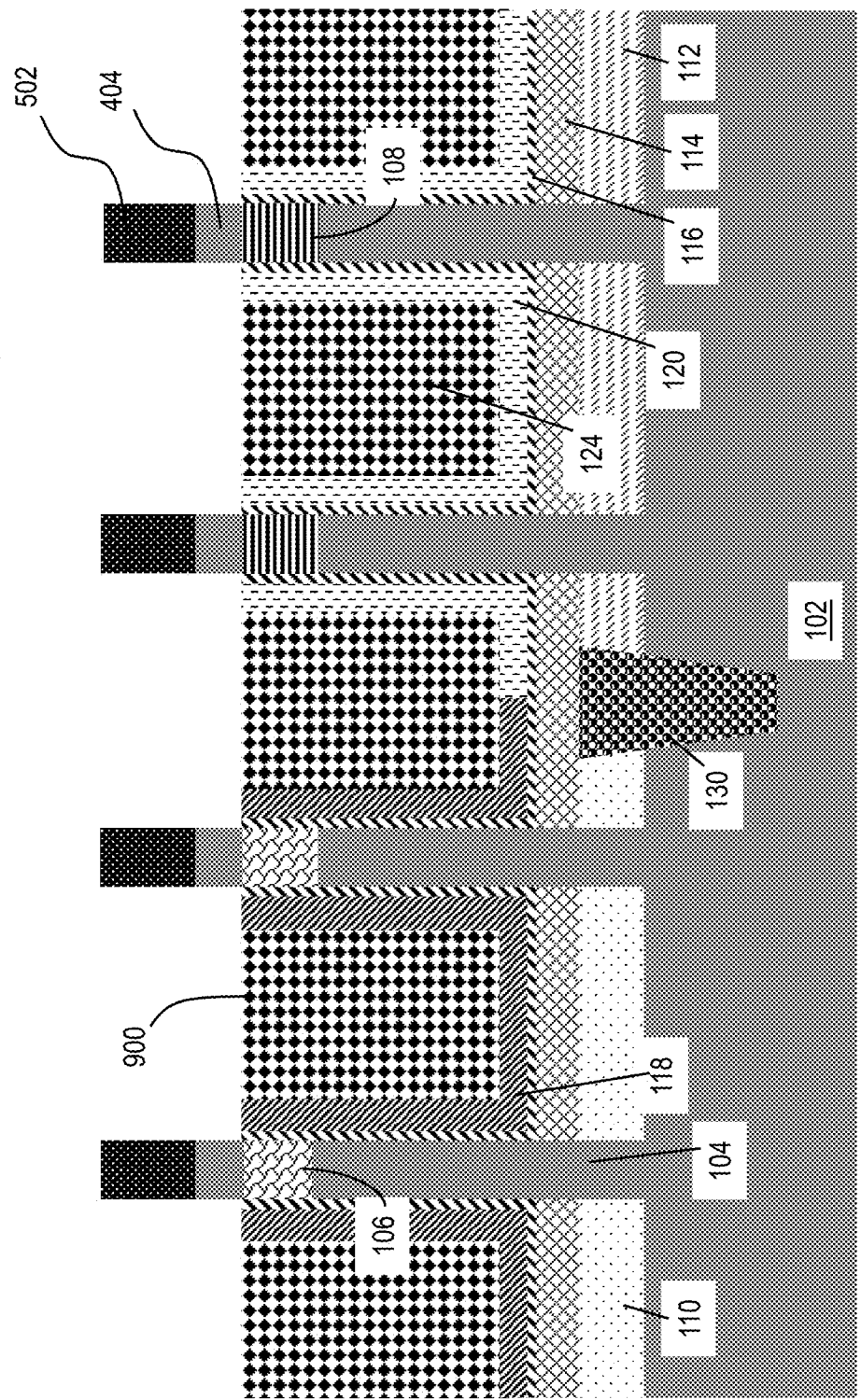

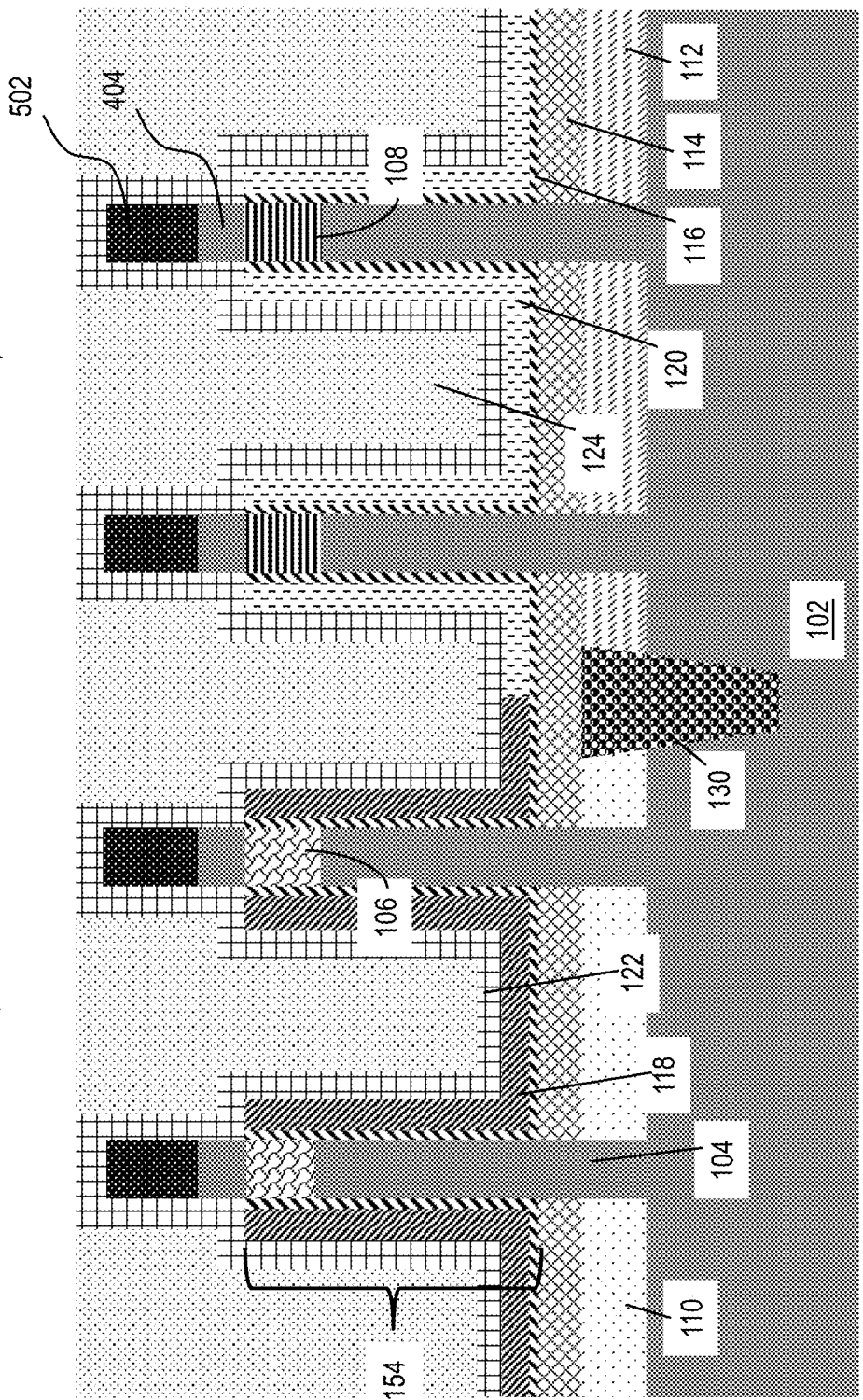

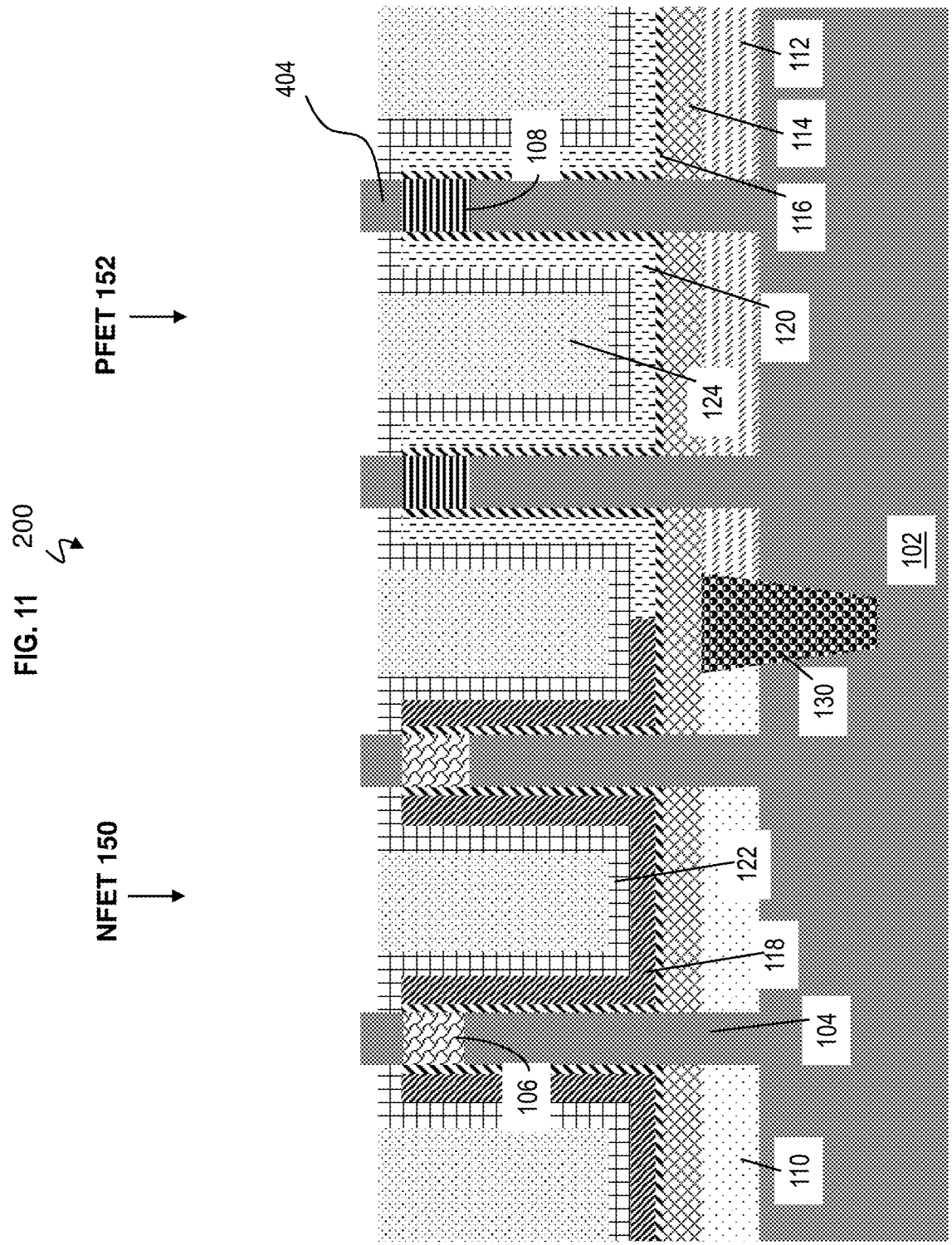

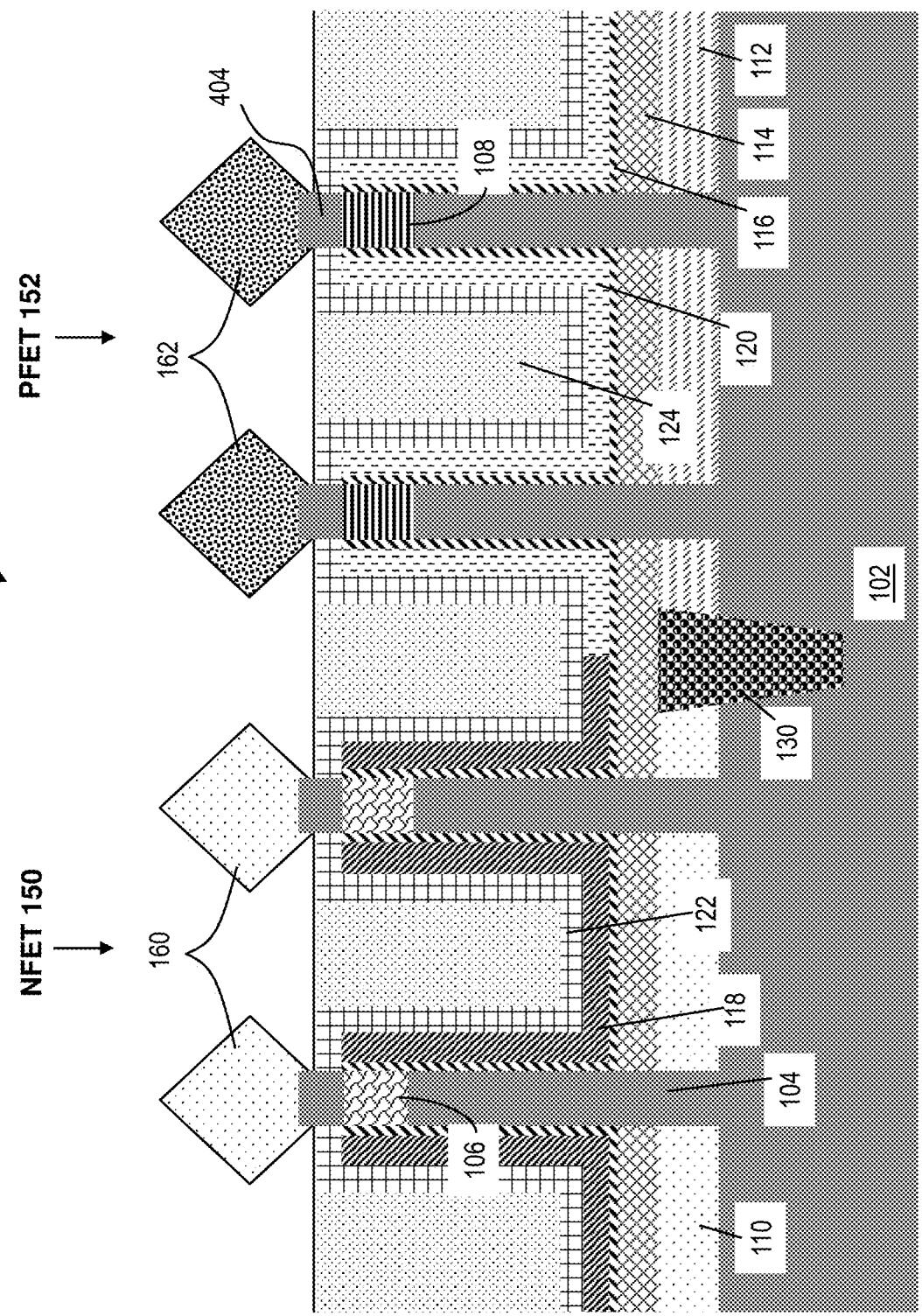

FIG. 13 1300

FORM A VERTICAL FIN HAVING A VERTICAL CHANNEL, ONE END OF THE VERTICAL CHANNEL COMPRISING A DOPED EPITAXIAL LAYER, THE DOPED EPITAXIAL LAYER CAUSING A THRESHOLD VOLTAGE AT THE ONE END TO BE DIFFERENT FROM A REMAINDER OF THE VERTICAL CHANNEL 1302

↓

FORM A SOURCE AND A DRAIN EACH COUPLED TO OPPOSITE ENDS OF THE VERTICAL FIN, GATE MATERIAL BEING FORMED ON THE VERTICAL CHANNEL 1304

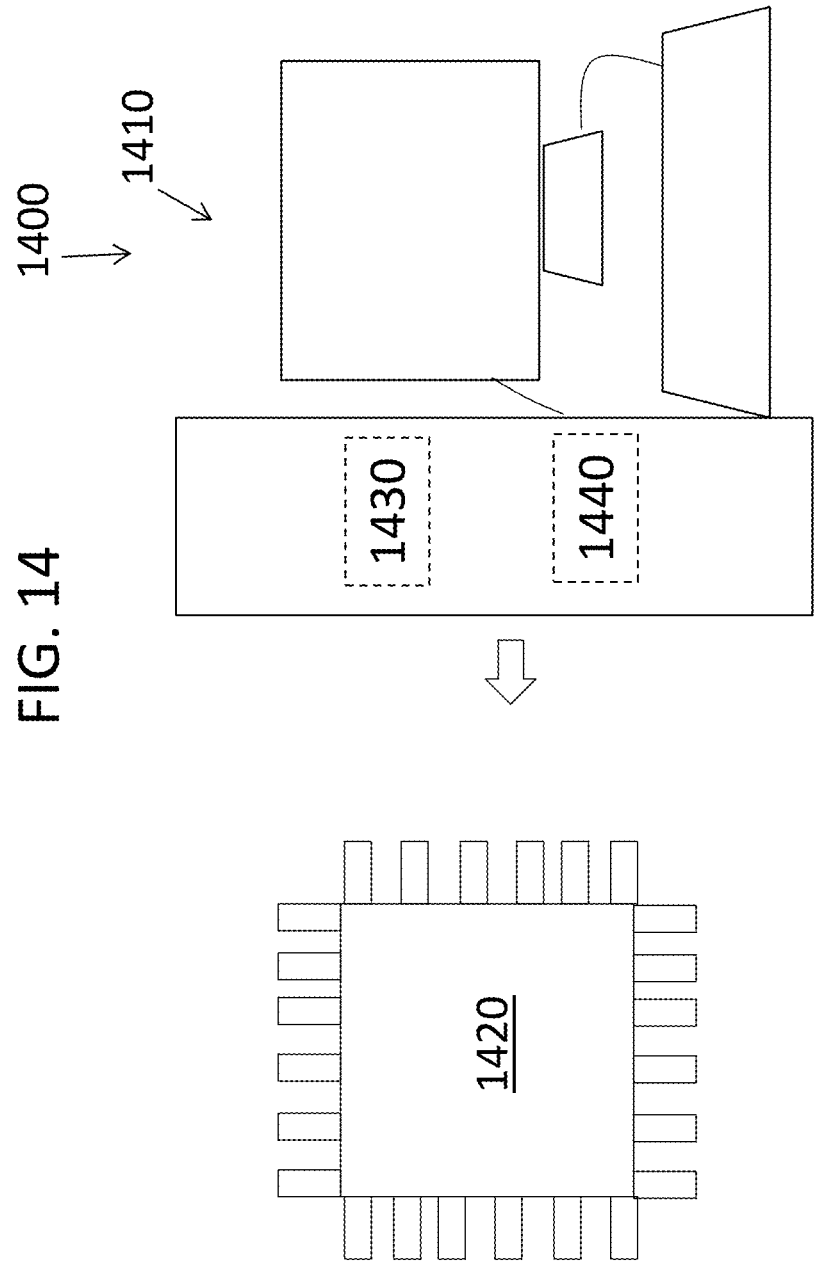

VERTICAL TRANSPORT FIELD EFFECT TRANSISTORS HAVING DIFFERENT THRESHOLD VOLTAGES ALONG THE CHANNEL

BACKGROUND

The present invention generally relates to fabrication methods and resulting structures for integrated circuits, and more specifically, to fabrication methods and resulting structures configured and arranged for vertical field effect transistors having different threshold voltages along the channel.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

One type of MOSFET is a non-planar FET known generally as a vertical transport FET (VTFET). VTFETs employ semiconductor fins and side-gates that can be contacted outside the active region, resulting in increased device density and some increased performance over lateral devices. In VTFETs the source to drain current flows in a direction that is perpendicular to a major surface of the substrate. For example, in a known VTFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

The threshold voltage (Vt) of a transistor is the voltage level that must be achieved between the gate and the source in order to turn the transistor on. More specifically, when a voltage greater than Vt is applied to the transistor gate, the transistor is turned on, and current flows from the transistor's source through the channel to the drain. When the voltage at the gate is less than Vt, the switch is off, and current does not flow through the transistor

SUMMARY

Embodiments of the present invention are directed to methods for a semiconductor structure/device with vertical field effect transistors having different threshold voltages along the channel. A non-limiting example method includes forming a vertical fin having a vertical channel, one end of the vertical channel including a doped layer, the doped layer causing a threshold voltage at the one end to be different from a remainder of the vertical channel. The method includes forming a source and a drain each coupled to opposite ends of the vertical fin, gate material being formed on the vertical channel.

According to one or more embodiments of the present invention, a non-limiting example method includes forming an n-type vertical transport field-effect transistor (VTFET) comprising a first vertical channel, one end of the first vertical channel comprising a p-type doped layer, the p-type doped layer causing a threshold voltage at the one end to be different from a remainder of the first vertical channel. The method includes forming a p-type VTFET comprising a second vertical channel, an end of the second vertical channel comprising an n-type doped layer, the n-type doped layer causing a threshold voltage at the end to be different from a remainder of the second vertical channel.

Other embodiments of the present invention implement features of the above-described methods in structures/devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 9 depicts a cross-sectional view of a portion of an IC under-fabrication after fabrication operations according to one or more embodiments of the invention;

FIG. 10 depicts a cross-sectional view of a portion of an IC under-fabrication after fabrication operations according to one or more embodiments of the invention;

FIG. 11 depicts a cross-sectional view of a portion of an IC under-fabrication after fabrication operations according to one or more embodiments of the invention;

FIG. 12 depicts a cross-sectional view of a portion of an IC under-fabrication after fabrication operations according to one or more embodiments of the invention;

FIG. 13 is a flow chart of a method for forming a portion of an IC having VTFETs having different threshold voltages along the vertical channel according to one or more embodiments of the invention;

FIG. 14 is a block diagram of a system to design/layout a portion of an IC having VTFETs having different threshold voltages along the vertical channel in accordance with one or more embodiments of the present invention.

DETAILED DESCRIPTION

Figure 1:
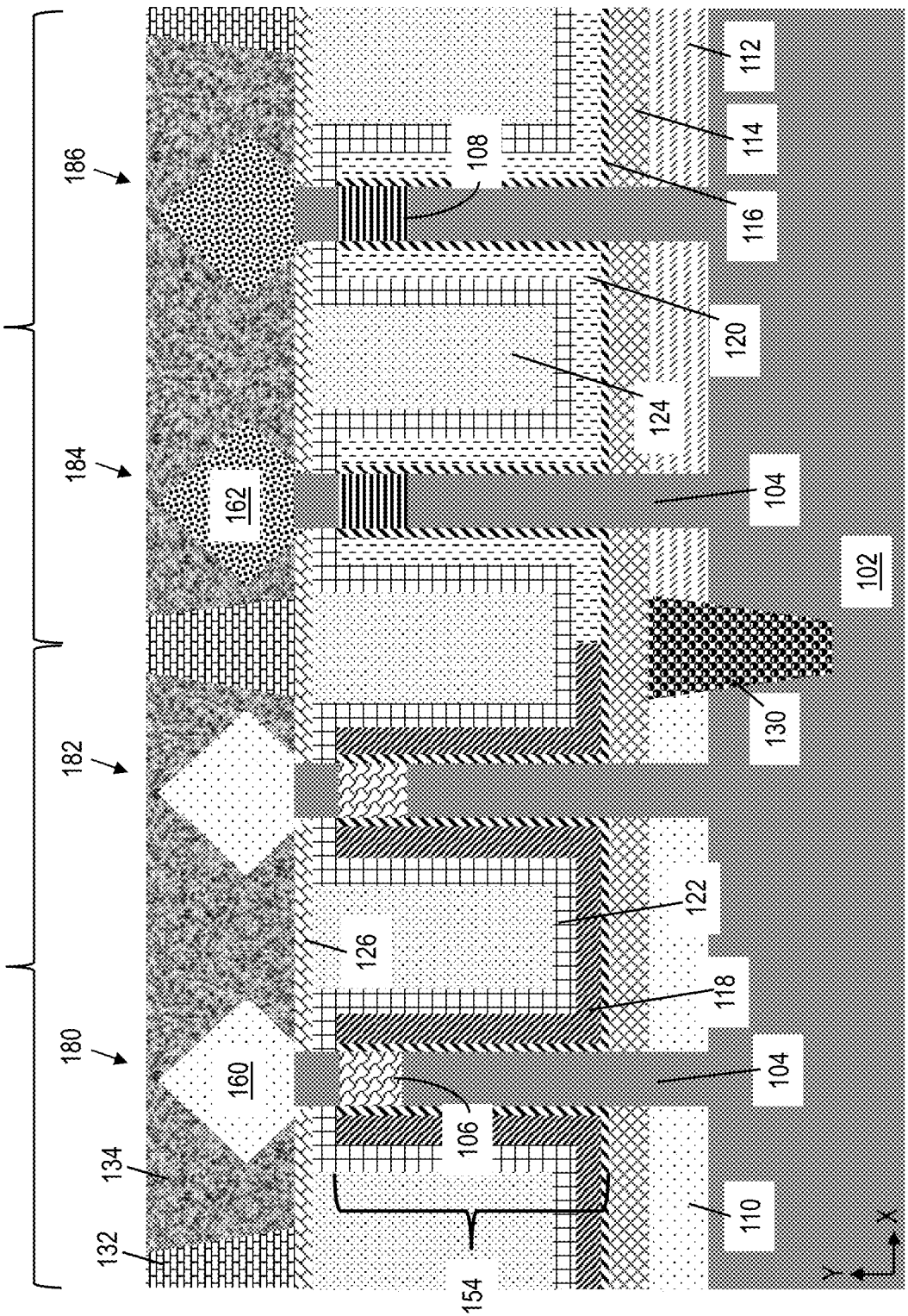
FIG. 1 depicts a cross-sectional view of a portion of an integrated circuit (IC) having vertical transport field-effect transistors VTFETs having different threshold voltages along the channel according to embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the Vt of an FET is the minimum gate-to-source voltage (Vgs) that is needed to turn the FET on and create a conducting path between the source terminal and the drain terminal. Vt is determined by several factors including the doping levels in the MOSFET channel. A technique known as lateral asymmetric channel (LAC) doping can, in theory, improve the electrical characteristics of planar MOS-FETs by making the channel doping concentration asymmetrical such that the channel doping concentration on the source side of the channel is higher than the channel doping concentration on the drain side of the channel. During device operation, the channel potential transition that occurs at the source-side of the channel region will, in theory, be much steeper in planar MOSFETs that use LAC due to the non-uniform channel doping. Providing a steep potential distribution near the source-side of the MOSFET channel would, in theory, enhance the lateral channel electric field, thereby increasing the carrier mobility in the channel.

In practice, however, known LAC doping techniques are difficult to implement and control because the methods (e.g., implantation) used to embed dopants in the source-side of the channel are difficult to control. For non-planar transistor architectures such as VTFETs, it is not practical to apply known LAC doping techniques because it is difficult to selectively implant dopants into the VTFET channel fin that is surrounded by the VTFET gate. Accordingly, non-planar fully depleted channel architectures such as VTFETs typically rely on the use of multiple work function metals in the gate stacks to achieve multiple Vt levels.

Accordingly, embodiments of the invention provide IC structures with novel VTFETs having a high threshold voltage near the source side by forming a lightly doped layer in the short channel near the source side, thereby providing an accurate threshold voltage near the source side. In some embodiments of the invention, the doped layer can be epitaxially grown with in-situ doping, thereby improving the accuracy of the doped layer in the short channel. One or more embodiments of the invention describe a novel VTFET having a high threshold voltage near its source as compared to the remainder of the vertical channel, which has a lower threshold voltage. The higher threshold voltage near the source improves the device performance due to the enhancement of electric field. This technique of a gradient threshold voltage in VTFETs can be achieved by using lightly doped layers. For example, an n-type implementation of the novel VTFET has a lightly n-type doped layer on the top portion of fin, while a p-type implementation of the novel VTFET has a lightly p-type doped layer on the top portion of the fin.

Turning now to a more detailed description of aspects of the present invention, FIG. 1 depicts a cross-sectional view of a portion of an IC 100 having an NFET side/region 150 and a PFET side/region 152 according to one or more embodiments of the invention. Two example n-type vertical transport FETs (VTFETs) 180, 182 are on the NFET side 150, and two example p-type VTFETs 184, 186 are on the PFET side 152. The VTEFTs 180, 182, 184, 186 are each formed to have a high threshold voltage near their respective source materials 160 and 162 (i.e., source), which improves the device performance because of enhancement of the electric field. It should be understood that any number of VTFETs can be provided on the NFET side 150, and any number of the VTFETs can be provided on the PFET side 152. The IC 100 includes vertical fins 104 formed on substrate 102. In this example, four fins are shown but it should be understood that more or fewer fins may be present. NFET side 150 can have more or fewer NFETs, and PFET side 152 can have more or fewer PFETs. Epitaxial material 106 is epitaxially grown on fins 104 on NFET side 150, and epitaxial material 108 is epitaxially grown on fins 104 on PFET side 152. Epitaxial material 106 is lightly doped with p-type dopants, while epitaxial material 108 is lightly doped with n-type dopants.

Drain material 110 (i.e., drain) is formed on substrate 102 on NFET side 150, and drain material 112 is formed on substrate 102 on PFET side 152. Shallow trench isolation material 130 separates drain material 110 from drain material 112. Bottom spacer material 114 is formed on drain materials 110, 112. High-k gate material 116 is formed on vertical channels 154 of IC 100, where each NFET and PFET has its own vertical channel 154. Work function material 118 is formed on high-k gate material 116 on the NFET side 150 for NFETs, while work function material 120 is formed on high-k gate material 116 on the PFET side 152 for PFETs. Gate encapsulation material 122 is formed on work function materials 118, 120. Fill material 124 is formed on gate encapsulation material 122, and a top spacer material 126 is formed on top. Source material 160 is formed on ends of fins 104 on NFET side 150, while source material 162 is formed on ends of fins 104 on PFET side 152. Source contact material 134 is formed on source materials 160, 162 within fill material 132.

FIGS. 2-12 depict the IC 100 after selected fabrication operations have been completed for forming the VTFETs 180, 182, 184, 186. While under fabrication, the IC 100 is identified in FIGS. 2-12 as IC under-fabrication 200. The fabrication operations depicted in FIGS. 2-12 form the VTFETs 180, 182, 184, 186 such that each includes a high threshold voltage near its respective sources and a lower threshold voltage for the remainder of the vertical channel 154 according to one or more embodiments of the invention. Standard semiconductor fabrication techniques can be utilized to fabricate IC 100 as understood by one of ordinary skill in the art. Any suitable deposition techniques and etching techniques can be utilized herein.

Figure 2:
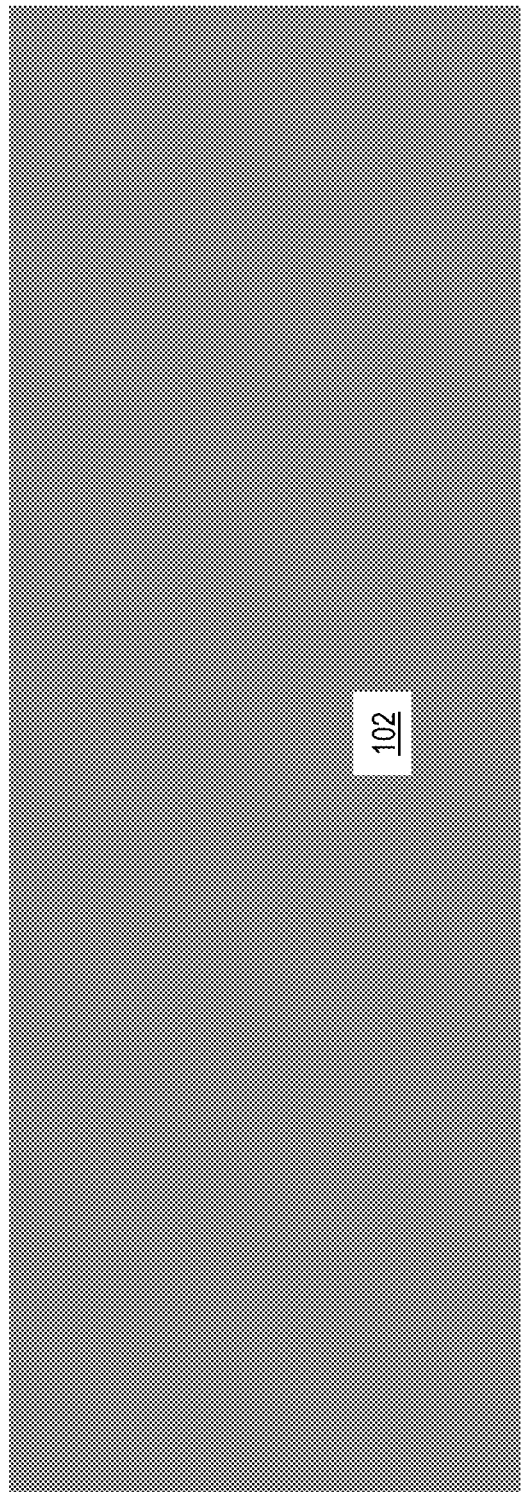
FIG. 2 depicts a cross-sectional view of a portion of an IC under-fabrication after fabrication operations according to one or more embodiments of the invention.

FIG. 2 depicts a cross-sectional view of IC under-fabrication 200 after fabrication operations according to one or more embodiments of the invention. FIG. 2 shows a semiconductor substrate 102. In one or more embodiments, semiconductor substrate 120 can be undoped silicon, bulk silicon, etc. Other materials can be utilized for semiconductor substrate 102.

Figure 3:
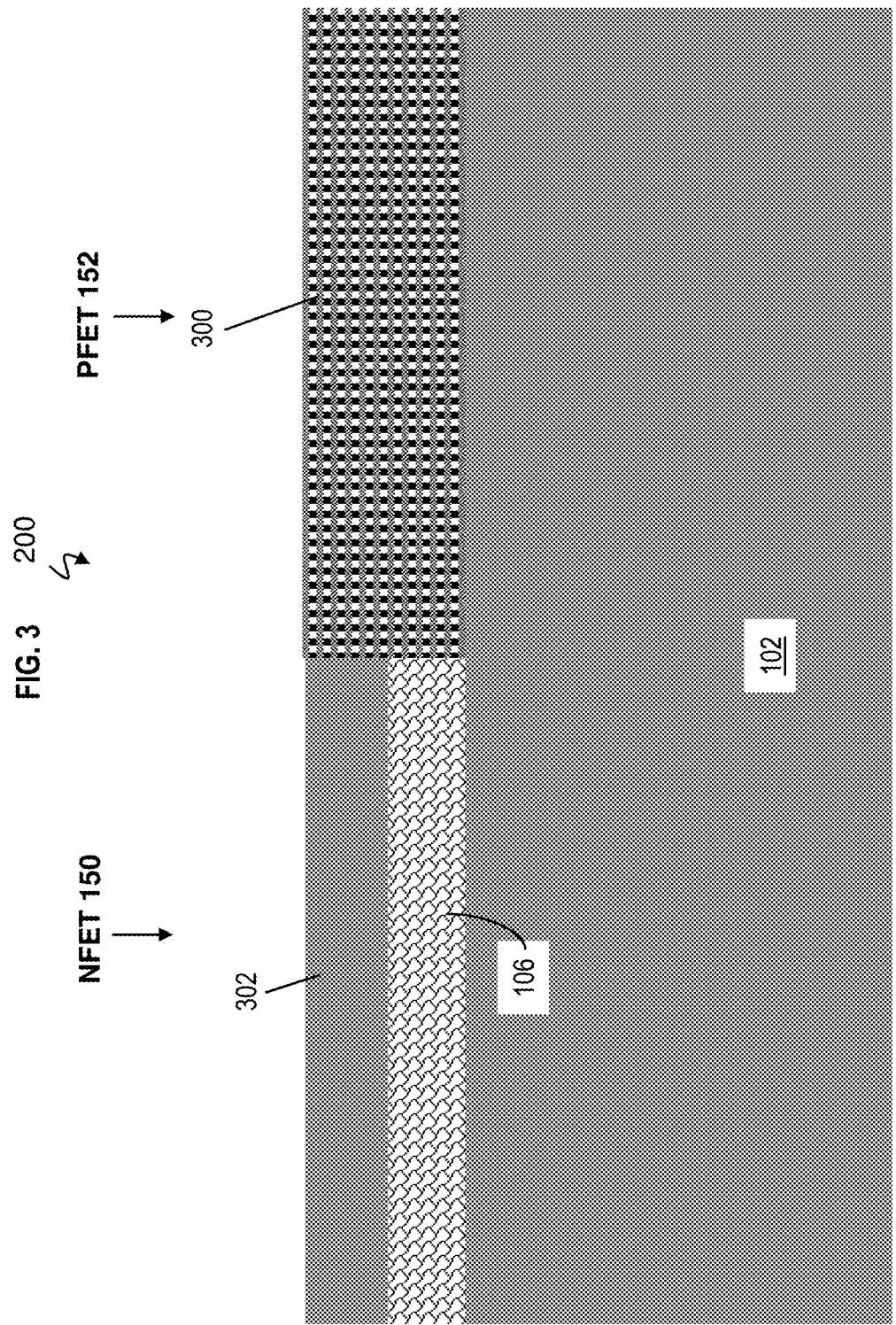
FIG. 3 depicts a cross-sectional view of a portion of an IC under-fabrication after fabrication operations according to one or more embodiments of the invention.

FIG. 3 depicts a cross-sectional view of IC under-fabrication 200 after fabrication operations according to one or more embodiments of the invention. A block mask 300 can be formed on PFET side 152 while NFET side 150 remains free of block mask 300. For example, block mask 300 can be a SiN film that is removed from NFET side 150 but remains on PFET side 152. Epitaxial material 106 is epitaxially grown on and from the top of substrate 102 on NFET side 150 as a uniformly doped epitaxial layer. The uniformly doped epitaxial material 106 is formed of p-type dopants. Example p-type dopants can include one or more of the following: boron, aluminum, gallium and indium. Subsequently, undoped semiconductor material 302 is formed on top of doped epitaxial material 106. Undoped semiconductor material 302 can be undoped silicon. Block mask 300 can be removed using a wet etch, dry etch, and/or combination in preparation for subsequent fabrication operations.

Figure 4:
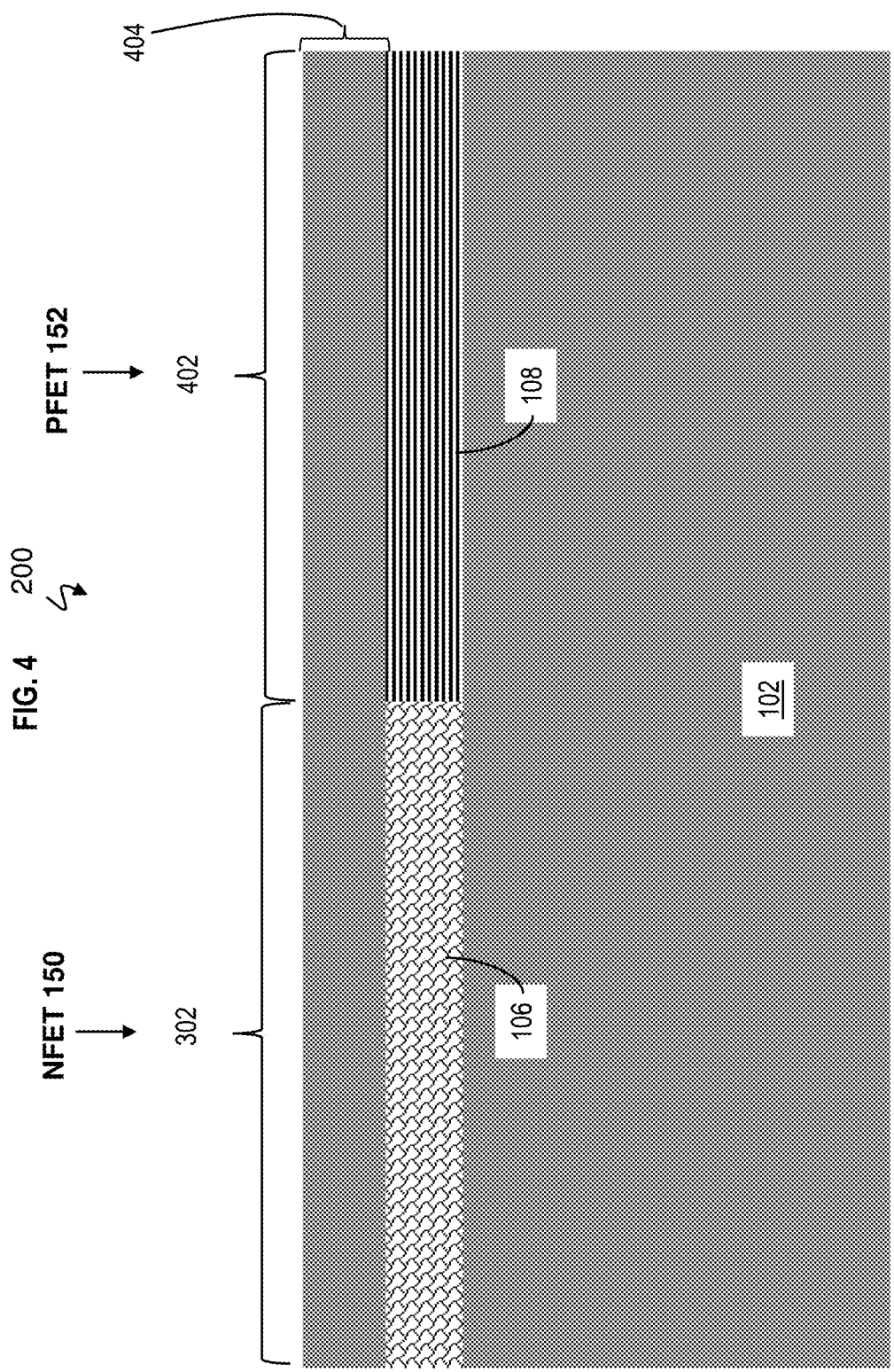
FIG. 4 depicts a cross-sectional view of a portion of an IC under-fabrication after fabrication operations according to one or more embodiments of the invention.

FIG. 4 depicts a cross-sectional view of IC under-fabrication 200 after fabrication operations according to one or more embodiments of the invention. The fabrication operations performed for the NFET side 150 in FIG. 3 are now analogously performed for the PFET side 152 in FIG. 4. For example, a block mask (similar to block mask 300 in FIG. 3) can be formed on NFET side 150 to protect undoped semiconductor material 302 while PFET side 152 remains free of the block mask. Epitaxial material 108 is epitaxially grown on the top of and from substrate 102 on PFET side 152 as a uniformly doped epitaxial layer. The uniformly doped epitaxial material 108 is formed of n-type dopants. Example n-type dopants can include one or more of the following: antimony, arsenic and phosphorous. Subsequently, undoped semiconductor material 402 is formed on top of doped epitaxial material 108. Undoped semiconductor materials 302 and 402 can generally be referred to as undoped semiconductor material 404. The block mask on NFET side 150 can be removed in preparation for subsequent fabrication operations. Any suitable deposition and etching techniques can be utilized in FIGS. 3, 4 and 5, in accordance with one or more embodiments of the invention.

The p-type doping of epitaxial material 106 and the n-type doping of epitaxial material 108 can have a concentration of dopants that ranges from about $1 \times 10^{18}$ cm$^3$ to $1 \times 10^{19}$ cm$^3$, which results in incremental increases in the threshold voltage as the concentration of dopants increases. Particularly, for a VTFET to achieve a 100 millivolt (mV) change (e.g., increase) in threshold voltage of the doped epitaxial layer (e.g., epitaxial material 106, 108) over the threshold voltage of the remainder of the vertical channel 154 depicted in FIG. 1, the concentration of dopants should range from about $6 \times 10^{18}$ cm$^3$ to $7 \times 10^{18}$ cm$^3$. Accurate threshold voltage control is provided in the VTFET having a short vertical channel 154 by using a doped epitaxial layer (e.g., epitaxial material 106, 108) instead of ion implantation. A typical short vertical channel for a VTFET may be 100 nanometers (nm). Short vertical channel for VTFETs can range from about 30-100 nm. In one or more embodiments of the invention, the epitaxial material 106, 108 can use about 30% of the short vertical channel to achieve the high threshold voltage near the source. The high threshold voltage near the source increases the source to drain current of the transistor.

Figure 5:
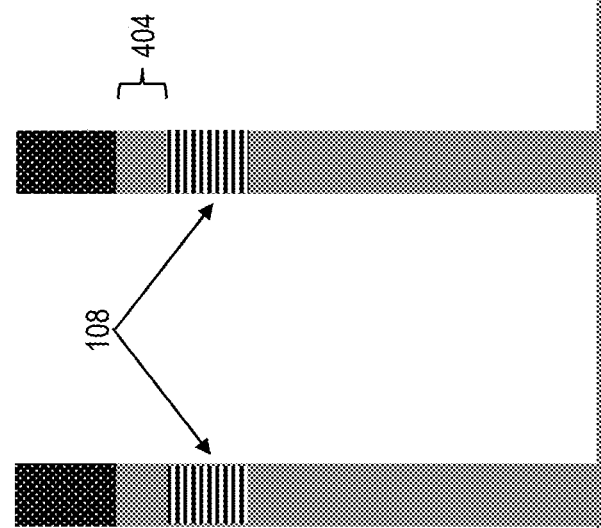
FIG. 5 depicts a cross-sectional view of a portion of an IC under-fabrication after fabrication operations according to one or more embodiments of the invention.

FIG. 5 depicts a cross-sectional view of IC under-fabrication 200 after fabrication operations according to one or more embodiments of the invention. FIG. 5 illustrates fin formation. A hardmask material 502 is formed on top of undoped semiconductor material 404 and is subsequently etched into a pattern. The hardmask materials can be organic materials and inorganic materials. Examples of organic type hardmasks include amorphous carbon, organo siloxane based materials with reflection control properties, etc. Examples of inorganic type hardmasks include SiN, SiON, TiN, etc.

Using etched hardmask material 502 as the pattern, etching is performed to form fins 104, which also etches undoped semiconductor material 404 and doped epitaxial materials 106, 108 in addition to etching a portion of substrate 102. Ion etching can be utilized to form fins 104. Also, in some cases, a wet etch and/or dry etch could be used.

Figure 6:
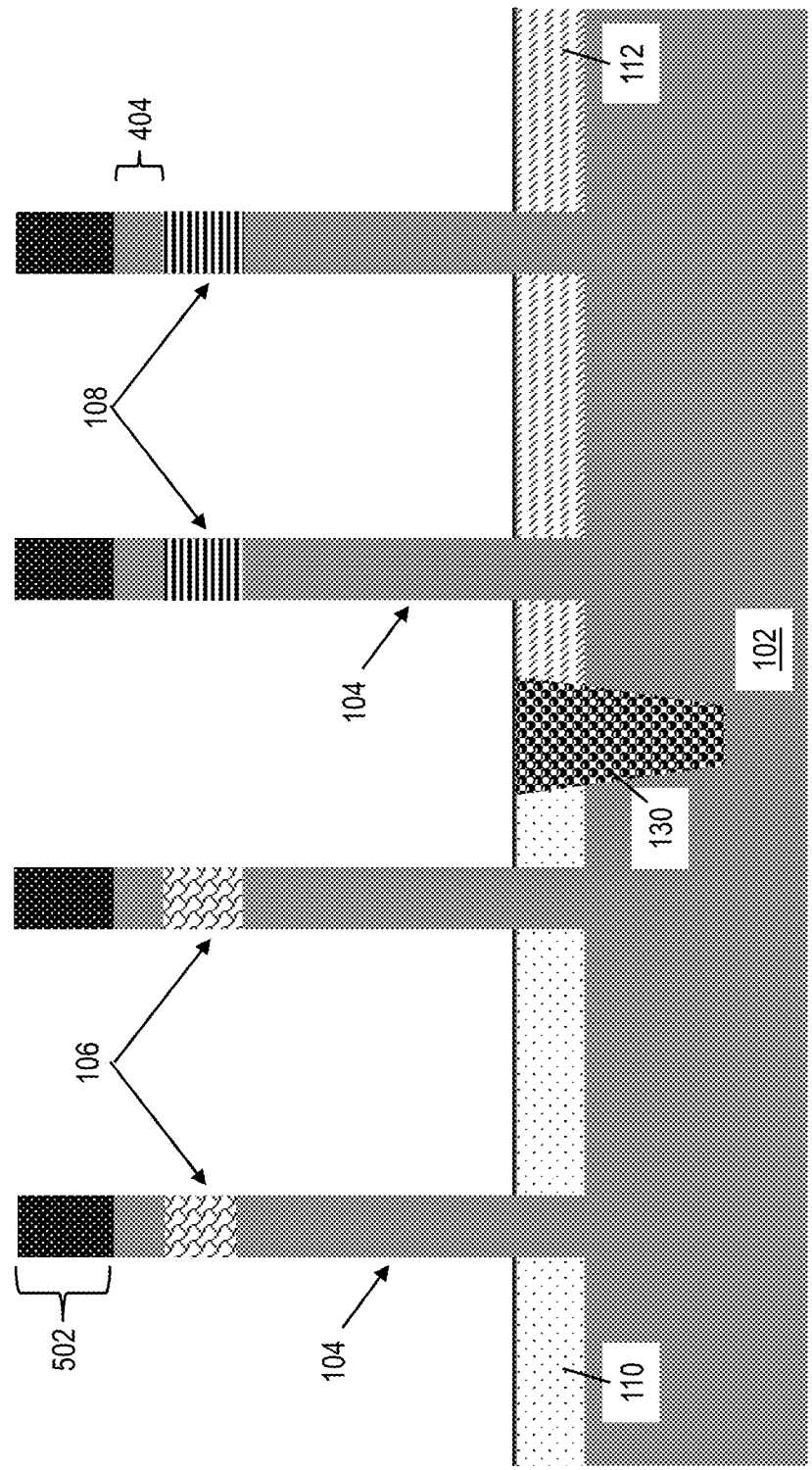
FIG. 6 depicts a cross-sectional view of a portion of an IC under-fabrication after fabrication operations according to one or more embodiments of the invention.

FIG. 6 depicts a cross-sectional view of IC under-fabrication 200 after fabrication operations according to one or more embodiments of the invention. FIG. 6 illustrates formation of the drains, which alternatively could be sources and vice versa. A block mask (similar to block mask 300 in FIG. 3) can be formed to protect PFET side 152, and drain material 110 is epitaxially grown from substrate 102 and fin 104 on NFET side 150. Drain material 110 can include n-type dopants, such as, for example, antimony, arsenic, phosphorous, etc. Drain material 110 can include silicon doped with phosphorous (e.g., Si:P).

A block mask (similar to block mask 300 in FIG. 3) can be formed to protect NFET side 150, and drain material 112 is epitaxially grown from substrate 102 and fin 104 on PFET side 152. Drain material 112 can include p-type dopants, such as, for example, boron, aluminum, gallium, indium, etc. Drain material 112 can include silicon germanium doped with boron (e.g., SiGe:B). The block mask is removed. A shallow trench isolation region 130 is formed in drain materials 110 and 112 and part of substrate 102. Shallow trench isolation region (STI) 130 may include a dielectric material, such as, for example, silicon dioxide, etc. For example, a trench can be formed and then filled with the dielectric material of STI region 130.

Figure 7:
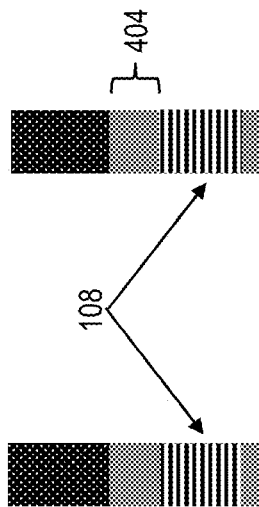
FIG. 7 depicts a cross-sectional view of a portion of an IC under-fabrication after fabrication operations according to one or more embodiments of the invention.

FIG. 7 depicts a cross-sectional view of IC under-fabrication 200 after fabrication operations according to one or more embodiments of the invention. FIG. 7 illustrates bottom spacer formation. Bottom spacer material 114 is deposited on top of drain materials 110 and 112 and shallow trench isolation region 130. Any spacer material deposited on top of hardmask material 502 can be etched off, for example, using chemical mechanical polishing/planarization. Example materials for bottom spacer material 114 can include SiN, SiBCN, SiON, SiCO, etc.

Figure 8:
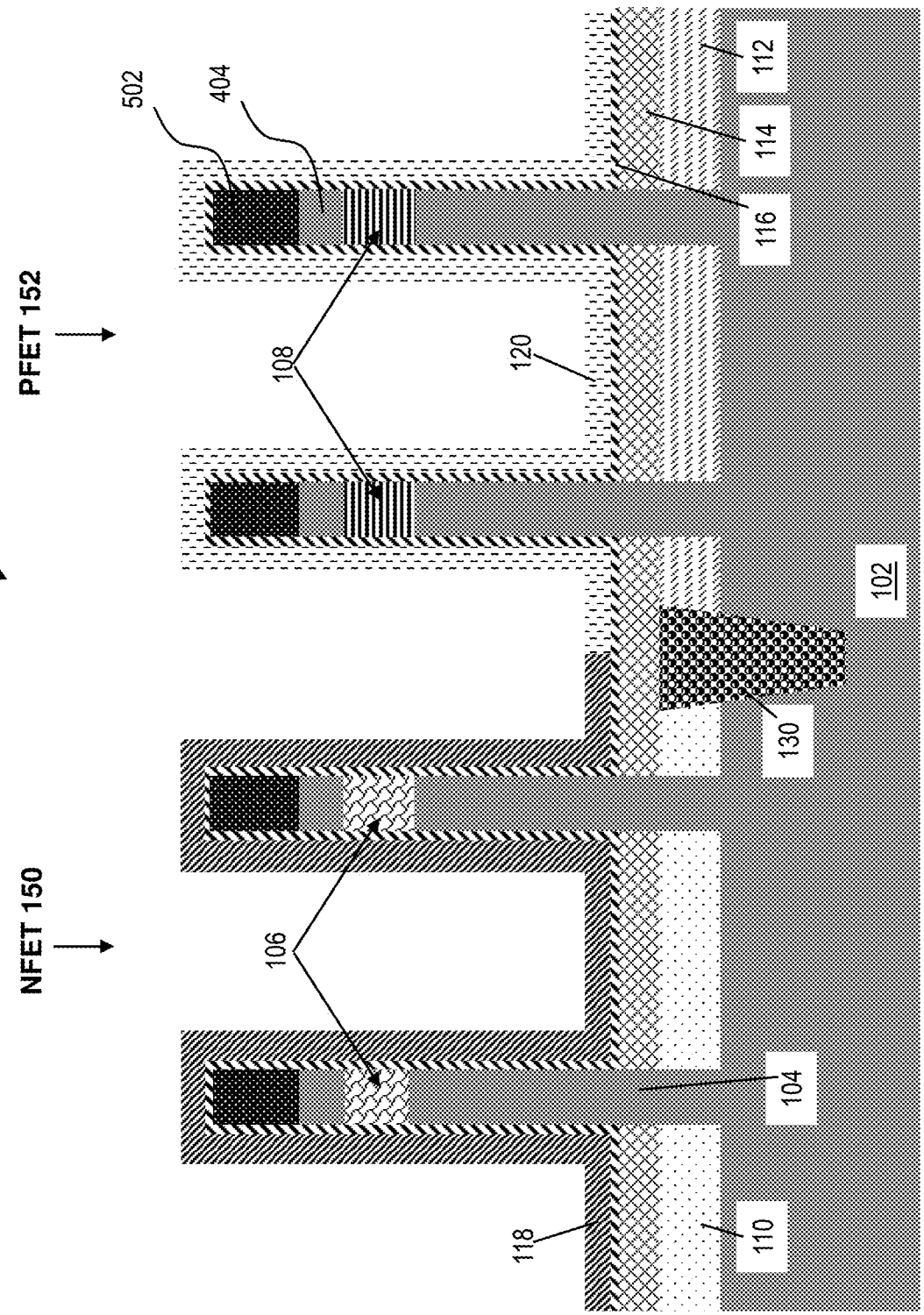
FIG. 8 depicts a cross-sectional view of a portion of an IC under-fabrication after fabrication operations according to one or more embodiments of the invention.

FIG. 8 depicts a cross-sectional view of IC under-fabrication 200 after fabrication operations according to one or more embodiments of the invention. FIG. 8 illustrates high-k and metal gate formation. High-k gate material 116 is conformally formed on the top surface of IC under-fabrication 200 which particularly covers fins 104, undoped semiconductor material 404, and doped epitaxial materials 106, 108. A block mask (similar to block mask 300 in FIG. 3) can be formed on PFET side 152, while work function material 118 is formed on NFET side 150. Work function material 118 can include, for example, TiN/TiAlC/TiN. Analogously, block mask (similar to block mask 300 in FIG. 3) can be formed on NFET side 150, while work function material 120 is formed on PFET side 152. Work function material 120 can include, for example, TiN.

High-k gate material 116 can include high-k dielectric materials. A high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.).

Work function materials 118 and 120 can include a work function metal that is immediately adjacent to the gate dielectric layer and that is preselected in order to achieve an optimal gate conductor work function given the conductivity type of the VTFET. For example, the optimal gate conductor work function for the PFETs can be, for example, between about 4.9 eV and about 5.2 eV. With respect to work function material 120, exemplary metals (and metal alloys) having a work function within or close to this range include, but are not limited to, ruthenium, palladium, platinum, cobalt, and nickel, as well as metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. With respect to work function material 118, exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal.

FIG. 9 depicts a cross-sectional view of IC under-fabrication 200 after fabrication operations according to one or more embodiments of the invention. FIG. 9 illustrates the high-k and metal gate etch. In FIG. 9, organic planarization layer (OPL) 900 is deposited on top of IC under-fabrication 200 and etched back using a wet etch and/or dry etch. OPL 900 can be a spin-on-carbon. OPL 900 may be formed of and/or include a photosensitive organic polymer comprising a light-sensitive material that, when exposed to electromagnetic (EM) radiation, is chemically altered and thus configured to be removed using a developing solvent. For example, OPL 900 may include polyacrylate resin, epoxy resin, phenol resin, polyamide resin, polyimide resin, unsaturated polyester resin, polyphenylenether resin, polyphenylenesulfide resin, or benzocyclobutene (BCB).

After recessing OPL 900, work function material 118, work function material 120, high-k gate material 116 are selectively etched back using, for example, a reactive ion etch, a wet etch, and/or a dry etch. Accordingly, hardmask material 502 and undoped semiconductor material 404 are exposed for further processing.

FIG. 10 depicts a cross-sectional view of IC under-fabrication 200 after fabrication operations according to one or more embodiments of the invention. FIG. 10 illustrates gate encapsulation. After removing OPL 900, gate encapsulation material 122 is formed on work function materials 118, 120, hardmask material 502, and undoped semiconductor material 404. Fill material 124 is formed on gate encapsulation material 122, and planarization (e.g., CMP) can be performed. Gate encapsulation material 122 can be a liner, such as a SiN liner. Other types of material can be used for gate encapsulation material 122 such as, for example, aluminum oxide. Fill material 124 can be a dielectric material, such as, for example, $SiO_2$, and other materials.

FIG. 11 depicts a cross-sectional view of IC under-fabrication 200 after fabrication operations according to one or more embodiments of the invention. Etching is performed to expose the top of the fins. While undoped semiconductor material 404 is protected by hardmask material 502, the top surface of IC under-fabrication 200 including portions of gate encapsulation material 122 and fill material 124 are etched back so as to be below the top of undoped semiconductor material 404. In one or more embodiments, gate encapsulation material 122 and fill material 124 can be recessed to the middle of undoped semiconductor material 404. The recessing can be performed by a reactive ion etch, and/or any other suitable etching method. Subsequently, hardmask material 502 is removed from the tops of undoped semiconductor material 404. Plasma etching may be utilized to remove hardmask material 502, as well as wet and/or dry etching.

In one or more embodiments of the invention, optionally, undoped semiconductor material 404 may not have been formed, and a portion of the doped epitaxial materials 106, 108 can extend above a top surface of the recessed gate encapsulation material 122 and fill material 124. Subsequently, hardmask material 502 is removed from the tops of doped epitaxial materials 106, 108 if undoped semiconductor material 404 is not present.

On NFET side 150, it should be appreciated that fin 104, p-type doped epitaxial material 106, and undoped semiconductor material 404 may be viewed as a fin of an NFET. Analogously, on PFET side 152, it should be appreciated that fin 104, n-type doped epitaxial material 108, and undoped semiconductor material 404 may be viewed as a fin of a PFET.

FIG. 12 depicts a cross-sectional view of IC under-fabrication 200 after fabrication operations according to one or more embodiments of the invention. FIG. 11 illustrates deposition of the top source epitaxial material. As discussed herein, one side such as NFET side 150 can be blocked off using a block mask such as block mask 300 in FIG. 3, while the top source material 162 is epitaxially grown from undoped semiconductor material 404 on PFET side 152. Analogously, the other side such as PFET side 152 can be blocked off using a block mask such as block mask 300 in FIG. 3, while the top source material 160 is epitaxially grown from undoped semiconductor material 404 on NFET side 150.

Source material 160 includes n-type dopants, such as, for example, antimony, arsenic, phosphorous, etc. For example, source material 160 can include silicon doped with phosphorous (e.g., Si:P). Source material 162 can include p-type dopants, such as, for example, boron, aluminum, gallium, indium, etc. For example, source material 162 can include silicon germanium doped with boron (e.g., SiGe:B).

After the fabrication operations depicted in FIG. 12, known fabrication operations are applied to the IC under-fabrication 200 to form the IC 100 shown in FIG. 1. Accordingly, as depicted in FIG. 1, known fabrication operations have been used to form a top spacer material 126 on top of IC 100 and is etched back. Top spacer material 126 can be an oxide, nitride, etc. Top spacer material can be an ultra-low-k dielectric material. After etching back top spacer material 126, fill material 132 is form on top of top spacer material 126, source material 160, and source material 162. Trenches are formed in fill material 132 to expose source material 160 and source material 162. Source contact material 134 is formed in the trenches to respectively contact source material 160 and source material 162. Source contact material 134 can be a metal contact, a metal alloy contact, etc. Source contact material 134 may include a silicide formed between the source material 160, 162 and the metal portion of the contact material 134.

FIG. 13 is a flow chart of a method 1300 of forming IC 100 with vertical field effect transistors having different threshold voltages along the vertical channel according to one or more embodiments of the invention. Reference can be made to FIGS. 1-12 where appropriate. At block 1302 of the method 1300, IC 100 is formed with a vertical fin (e.g., vertical fins 104) having a vertical channel 154, one end of the vertical channel 154 including a doped epitaxial layer (e.g., doped epitaxial material 106, 108), the doped epitaxial layer causing a threshold voltage at the one end to be different from a remainder (e.g., the undoped portion of the vertical channel) of the vertical channel 154. At block 1304, IC 100 is formed with VTFETs 180, 182, 184, 186, having a source (e.g., source material 160, 162) and a drain (e.g., drain material 110, 112) each coupled to opposite ends of the vertical fin (e.g., vertical fins 104), gate material (e.g., high-k gate material 116 and work function material 118 and/or high-k gate material 116 and work function material 120) being formed on the respective vertical channel of each VTFET 180, 182, 184, 186.

The threshold voltage at the one end (e.g., doped epitaxial material 106, 108) is higher than another threshold voltage for the remainder (e.g., the undoped portion of the vertical channel, which is not doped epitaxial material 106, 108) of the vertical channel 154. The doped epitaxial layer (e.g., doped epitaxial material 106, 108) comprises doped material. The doped epitaxial layer (e.g., doped epitaxial material 106, 108) comprises a uniform distribution of doped material. A channel length of the vertical channel 154 comprises the doped epitaxial layer (e.g., doped epitaxial material 106, 108).

The doped epitaxial layer (e.g., doped epitaxial material 106) comprises a p-type dopant for the vertical fin of an n-type transistor (e.g., on the NFET side 150). The doped epitaxial layer (e.g., doped epitaxial material 108) comprises an n-type dopant for the vertical fin of an p-type transistor (e.g., PFET side 152).

According to one or more embodiments of the invention, a method is provided of forming IC 100 with vertical field effect transistors having different threshold voltages along the vertical channel according to one or more embodiments of the invention. The method includes forming an n-type vertical transport field-effect transistor (VTFET) 180, 182 comprising a first vertical channel 154, one end of the first vertical channel 154 comprising a p-type doped layer (e.g., doped epitaxial material 106), the p-type doped layer (e.g., doped epitaxial material 106) causing a first threshold voltage at the one end to be different from a first remainder of the first vertical channel 154. The method includes forming a p-type VTFET 184, 186 comprising a second vertical channel 154, an end of the second vertical channel 154 comprising an n-type doped layer (e.g., doped epitaxial material 108), the n-type doped layer (e.g., doped epitaxial material 108) causing a second threshold voltage at the end to be different from a second remainder of the second vertical channel 154.

FIG. 14 is a block diagram of a system 1400 according to embodiments of the invention. The system 1400 includes processing circuitry 1410 used to generate the design 1430 that is ultimately fabricated into an integrated circuit 1420, which can include a variety of active semiconductor device (e.g., VTFETs 180, 182, 184, 186). The steps involved in the fabrication of the integrated circuit 1420 are well-known and briefly described herein. Once the physical layout 1440 is finalized, based, in part, on IC 100 having vertical field effect transistors having different threshold voltages along the vertical channel according to embodiments of the invention, the finalized physical layout 1440 is provided to a foundry. Masks are generated for each layer of the integrated circuit based on the finalized physical layout. Then, the wafer is processed in the sequence of the mask order. The processing includes photolithography and etch. This is further discussed with reference to FIG. 15.

Figure 15:
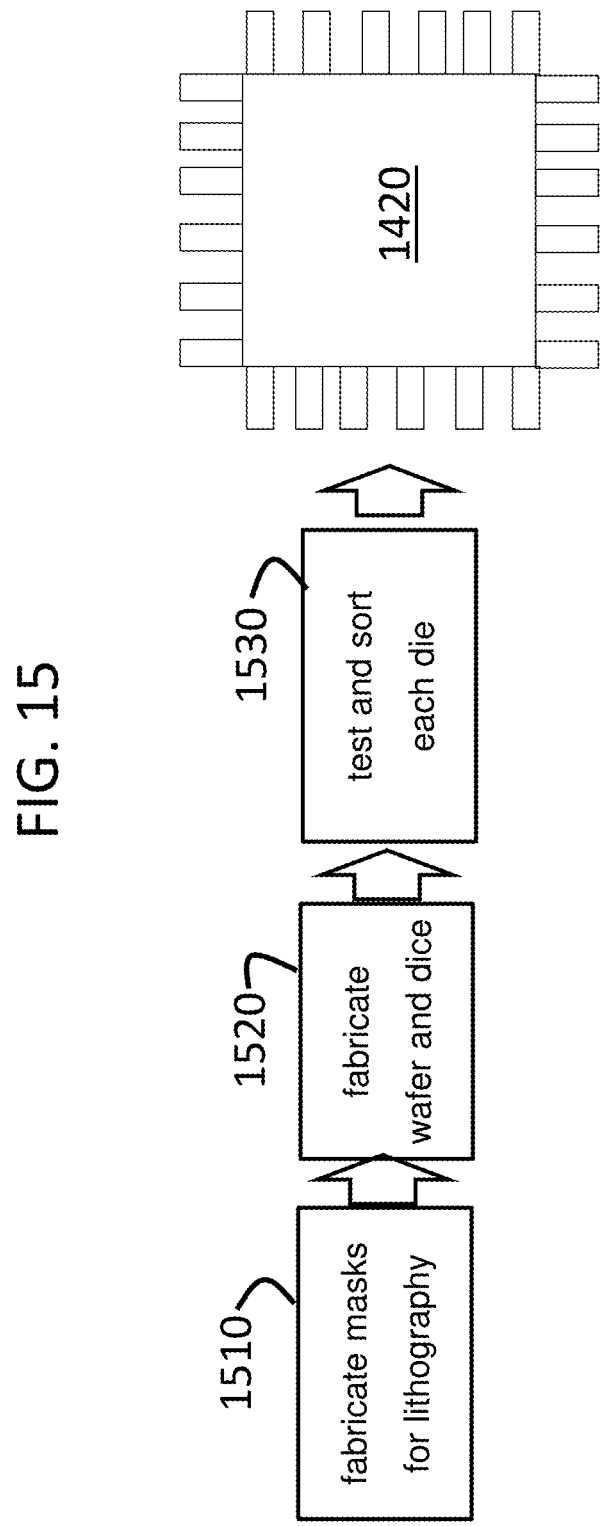
FIG. 15 is a process flow of a method of fabricating the IC of FIG. 14 in accordance with one or more embodiments of the present invention.

FIG. 15 is a process flow of a method of fabricating the integrated circuit according to exemplary embodiments of the invention. Once the physical design data is obtained, based, in part, IC 100 for vertical field effect transistors having different threshold voltages along the vertical channel, the integrated circuit 1420 can be fabricated according to known processes that are generally described with reference to FIG. 15. Generally, a wafer with multiple copies of the final design is fabricated and cut (i.e., diced) such that each die is one copy of the integrated circuit 1420. At block 1510, the processes include fabricating masks for lithography based on the finalized physical layout. At block 1520, fabricating the wafer includes using the masks to perform photolithography and etching. Once the wafer is diced, testing and sorting each die is performed, at block 1530, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    forming a vertical fin having a vertical channel, one end of the vertical channel comprising a doped layer and an opposite end comprising undoped silicon, the doped layer causing a threshold voltage at the one end to be different from a remainder of the vertical channel; and
    forming a source and a drain each coupled to opposite ends of the vertical fin such that the drain is coupled to the undoped silicon, gate material being formed on the vertical channel, wherein the vertical fin comprises an intervening portion of undoped semiconductor material between the doped layer and the source.

2. The method of claim 1, wherein the threshold voltage at the one end is higher than another threshold voltage for the remainder of the vertical channel.

3. The method of claim 1, wherein the doped layer comprises doped material.

4. The method of claim 1, wherein the doped layer comprises a uniform distribution of doped material.

5. The method of claim 1, wherein a length of the vertical channel comprises the doped layer.

6. The method of claim 1, wherein the doped layer comprises a p-type dopant for the vertical fin of an n-type transistor.

7. The method of claim 1, wherein the doped layer comprises an n-type dopant for the vertical fin of an p-type transistor.

8. The method of claim 1, wherein the remainder of the vertical channel comprises undoped material.

9. The method of claim 1, wherein the vertical channel comprises silicon.

10. The method of claim 1, wherein the source is epitaxially grown from the intervening portion of undoped semiconductor material.

* * * * *